(12) United States Patent
Olivieri et al.

(10) Patent No.: US 10,617,020 B1
(45) Date of Patent: Apr. 7, 2020

(54) ELECTRONIC ASSEMBLY WITH RETENTION OF CABLE

(71) Applicant: Deere & Company, Moline, IL (US)

(72) Inventors: Pablo G. Olivieri, Long Beach, CA (US); Stephen Piltingsrud, Fargo, ND (US)

(73) Assignee: DEERE & COMPANY, Moline, IL (US)

(*) Notice: Subject to any disclaimer, the term of this patent is extended or adjusted under 35 U.S.C. 154(b) by 0 days.

(21) Appl. No.: 16/354,918

(22) Filed: Mar. 15, 2019

(51) Int. Cl.
| | |
|---|---|
| *H05K 5/00* | (2006.01) |
| *H05K 7/20* | (2006.01) |
| *H05K 7/14* | (2006.01) |
| *H01R 12/52* | (2011.01) |
| *H05K 1/14* | (2006.01) |
| *H05K 7/10* | (2006.01) |

(52) U.S. Cl.
CPC .............. *H05K 5/006* (2013.01); *H01R 12/52* (2013.01); *H05K 1/14* (2013.01); *H05K 7/10* (2013.01); *H05K 7/1422* (2013.01); *H05K 7/20409* (2013.01)

(58) Field of Classification Search
CPC ....................................................... H05K 5/00
See application file for complete search history.

(56) References Cited

U.S. PATENT DOCUMENTS

| 7,113,406 B1* | 9/2006 | Nguyen | ............. | H01L 23/4006 165/185 |
| 2016/0037621 A1* | 2/2016 | Olivieri | ............. | H05K 7/20445 361/707 |

* cited by examiner

*Primary Examiner* — Jerry Wu (57) ABSTRACT

An electronic assembly comprises a circuit board having one or more electronic components mounted on the circuit board. The circuit board has a first side and a second side opposite the first side. The electronic assembly has a lower enclosure and an upper enclosure for mating with the lower enclosure to form a housing to hold the circuit board. A frame overlies the first side or the second side of the circuit board. The frame comprises a first retainer for retaining coaxial cable. The first retainer comprises a first pair of opposing arcuate members extending from the frame.

19 Claims, 8 Drawing Sheets

ELECTRONIC ASSEMBLY WITH RETENTION OF CABLE

FIELD

This disclosure relates to an electronic assembly with retention of cable.

BACKGROUND

In certain prior art, an enclosure may comprise enclosure portions that are mated together during electronic assembly. If the electronic assembly has electrical cable that is routed between a connector on the exterior of the assembly and the internal circuitry within the electronic assembly, during manufacturing of the electronic assembly, the electrical cable may become pinched between the enclosure portions or prevent proper seating of the enclosure portions. Accordingly, there is a need for an electronic assembly with improved retention of cable, such as coaxial cable.

SUMMARY

In one embodiment, an electronic assembly comprises a circuit board having one or more electronic components mounted on the circuit board. The circuit board has a first side and a second side opposite the first side. The electronic assembly has a lower enclosure and an upper enclosure for mating with the lower enclosure to form a housing to hold the circuit board. A frame overlies the first side or the second side of the circuit board. The frame comprises a first retainer for retaining coaxial cable. The first retainer comprises a first pair of opposing arcuate members extending from the frame.

BRIEF DESCRIPTION OF THE DRAWINGS

Like reference numbers in any set of two or more drawings indicates like features or elements.

DETAILED DESCRIPTION

Figure 1A:
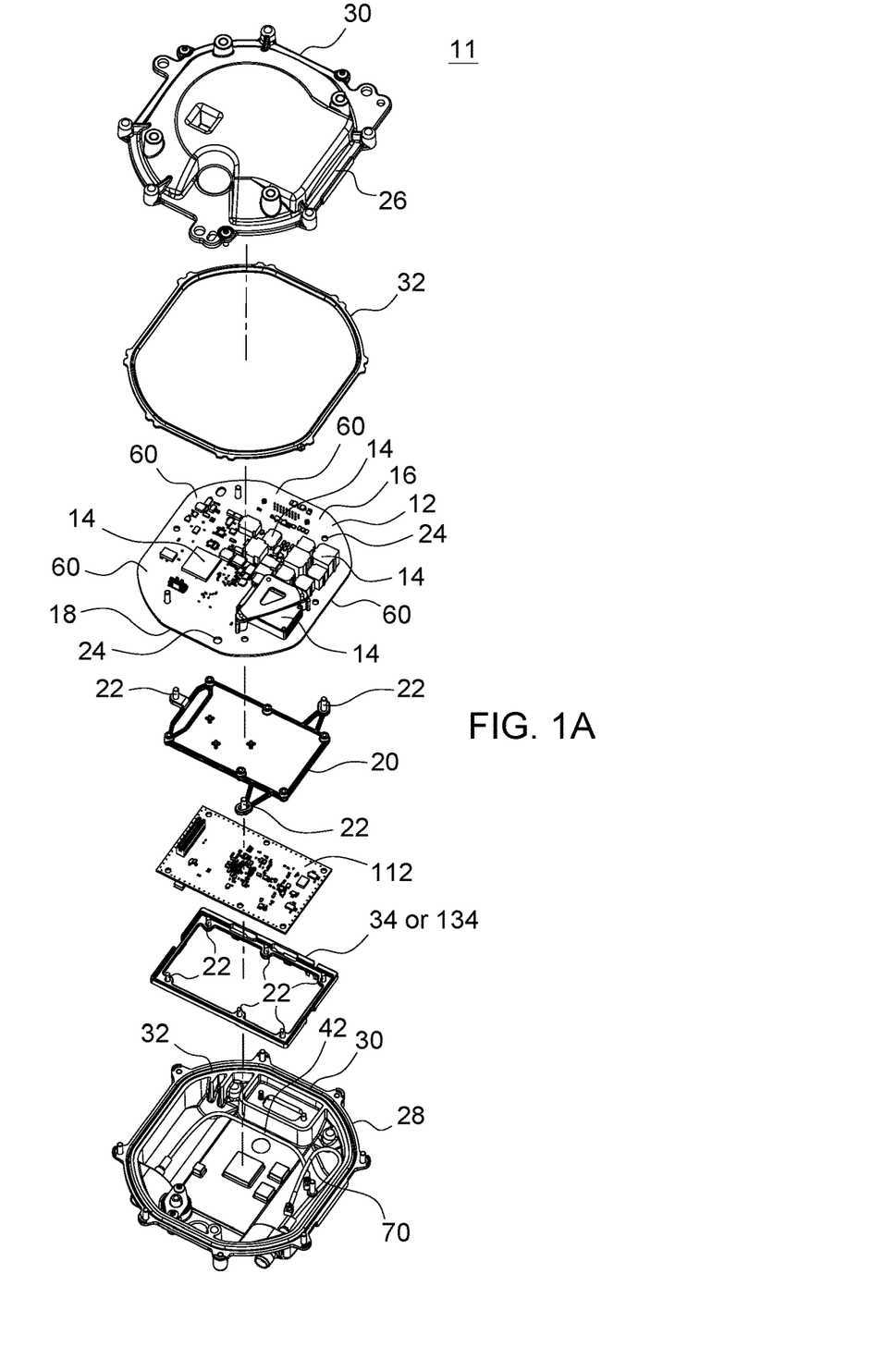
FIG. 1A is an exploded perspective view of one embodiment of the electronic assembly, as viewed from below.
Figure 1B:
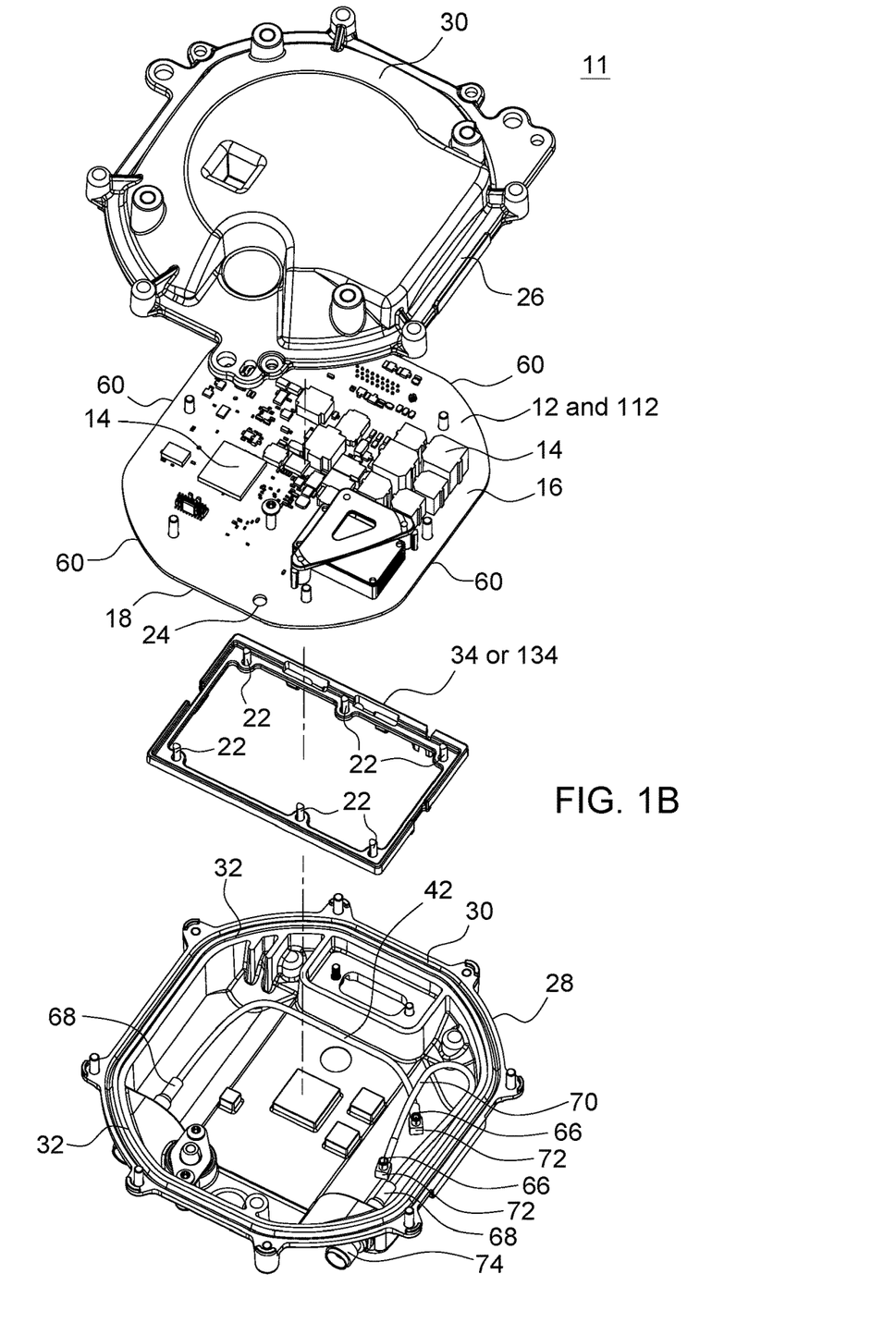
FIG. 1B is an exploded perspective view of one embodiment of the electronic assembly, where the set of circuit boards are combined or assembled; as viewed from below.

In FIG. 1A and FIG. 1B in one embodiment, an electronic assembly 11 comprises one or more circuit boards (12, 112) that has one or more electronic components 14 mounted on each circuit board (12, 112); the circuit board 12 has a first side 16 and a second side 18 opposite the first side 16. As illustrated in FIG. 1A, the electronic assembly 11 has a set of circuit boards (12, 112) that are stacked or separated by an intervening framework 20. For example, intervening framework 20 may align or register the circuit boards (12, 112) via one or more alignment projections 22 (e.g., pins) and corresponding recesses 24 (e.g., openings or holes) in one or more circuit boards (12, 112). Further, the set of circuit boards (12, 112), the framework 20, and the frame (34, 134) may be mechanically connected to or secured to a lower enclosure 26 or an interior of the housing 30.

As illustrated in FIG. 1A and FIG. 1B, the top of electronic assembly 11 faces downward; the electronic assembly 11 has a lower enclosure 26 and an upper enclosure 28 for mating with the lower enclosure 26 to form a housing 30 to hold one or more circuit boards (12, 112). For example, in one embodiment, the lower enclosure 26 and the upper enclosure 28 directly seat, contact, or mate together, whereas in other embodiments sealant or an intervening seal 32 may provide protection against the ingress of dirt, dust, salt, moisture into the interior of the housing 30.

Figure 2:
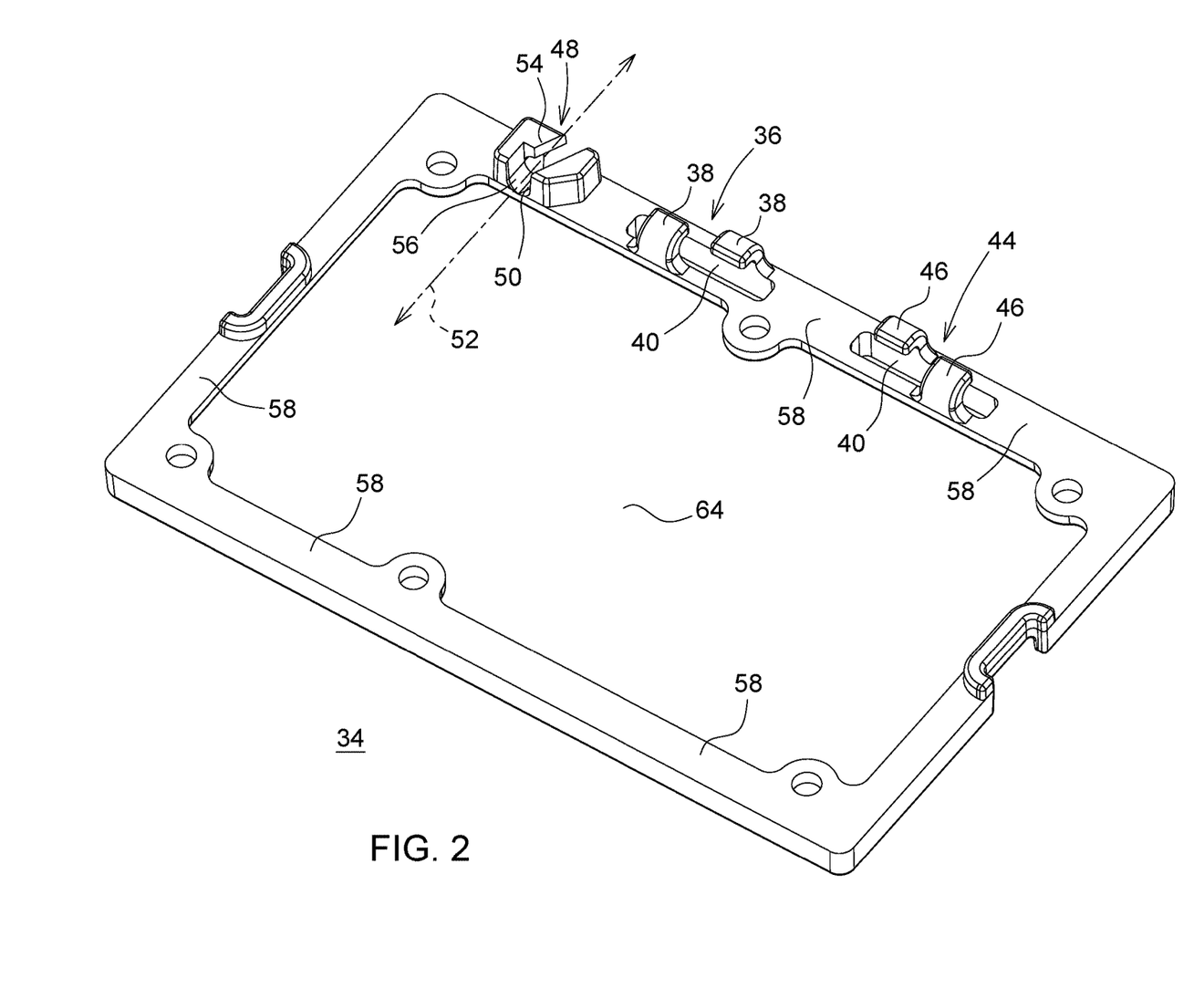
FIG. 2 is a perspective view (e.g., top view) of one embodiment a frame with retainers in accordance with FIG. 1.

As shown in FIG. 1B and FIG. 2, a frame 34 overlies the first side 16 or the second side 18 of the circuit board 12. The frame 34 comprises a first retainer 36 (in FIG. 2) for retaining coaxial cable 42. The first retainer 36 comprises a first pair of opposing arcuate members 38 extending from the frame 34. For example, each arcuate member 38 may define an arc segment of a substantially annular protrusion or semi-annular protrusion.

In an alternate configuration, each arcuate member 38 may be formed or composed of a plastic, polymer, an elastomer, fiber-filled plastic, fiber-filled polymer, plastic composite, or polymer composite with a range of elastic deformation that is suitable for retaining a cable with a substantially elliptical or circular cross section.

In one embodiment, the first retainer 36 further comprises a longitudinal groove 40 in the frame 34 between the first pair of opposing arcuate members 38. As illustrated in FIG. 2, the length of the longitudinal groove 40 extends beyond the arcuate members 38, although the length of the longitudinal groove may vary in different embodiments that fall within the scope of the claims. Further, the first pair of arcuate members 38 and the groove 40 are configured to hold cooperatively a cable (e.g., 42) with a substantially elliptical or substantially circular cross section. For example, a coaxial cable 42 (e.g., primary coaxial cable) is secured by the first retainer 36 during assembly or mating of the upper enclosure 28 and the lower enclosure 26 to prevent the coaxial cable 42 from interfering with the seating of the upper enclosure 28 and the lower enclosure 26.

As best illustrated in FIG. 2 in one configuration, the frame 34 comprises a second retainer 44; the second retainer 44 comprises a second pair of opposing arcuate members extending from the frame 34. As illustrated in FIG. 2, the length of the longitudinal groove 40 extends beyond the arcuate members 46, although the length of the longitudinal groove may vary in different embodiments that fall within the scope of the claims. Further, the frame 34 comprises a longitudinal groove 40 in the frame 34 between the second pair of opposing arcuate members. The second pair of arcuate members 46 and the groove are configured to hold cooperatively a cable with a substantially elliptical or substantially circular cross section. For example, each arcuate member 46 may define an arc segment of a substantially annular protrusion or semi-annular protrusion.

In an alternate configuration, each arcuate member 46 may be formed or composed of a plastic, polymer, an elastomer, fiber-filled plastic, fiber-filled polymer, plastic composite, or polymer composite with a range of elastic deformation that is suitable for retaining a cable with a substantially elliptical or circular cross section.

In one embodiment, the frame 34 comprises a third retainer 48 having a channel 50 with a channel longitudinal axis 52 that crosses the frame 34. For example, the channel longitudinal axis 52 may be oriented substantially orthogonal to the frame 34 or a frame axis that generally parallel to or aligned with the longitudinal groove 40. The channel 50 has an upper section 54 with a narrowed slot (e.g., with tight clearance for cable retention that may elastically deform to allow the cable to pass through to rest at the lower seating section 56) and a lower seating section 56 for seating a cable with a substantially elliptical or substantially circular cross section.

In an alternate configuration, the third retainer 48 may be formed or composed of a plastic, polymer, an elastomer, fiber-filled plastic, fiber-filled polymer, plastic composite, or polymer composite with a range of elastic deformation that is suitable for retaining a cable with a substantially elliptical or circular cross section.

In any configuration, the frame 34 comprises a generally rectangular member 58 or another shape the tracks the perimeter of a circuit board 12, circuit board 112, or both as a circuit board assembly. For example, the frame 34 may comprise a skeleton, such as generally rectangular member 58 (in FIG. 2), a substantially elliptical member, or a substantially annular member, or a frame 34 with rectilinear segments and curved segments, where: (1) the size and shape of the frame 34 may track, follow, be coextensive with, or commensurate with an outer periphery 60 or perimeter of the circuit board (12 or 112) and/or (2) the size and shape of the frame 34 may be spaced apart from a central region of the circuit board (12 or 112) where electronic components 14 or electrical components are mounted. Further, the frame 34 may align or register one or more circuit boards (12, 112) via one or more alignment projections 22 (e.g., pins) and corresponding recesses 24 (e.g., openings or holes) in one or more circuit boards (12, 112).

Figure 4:
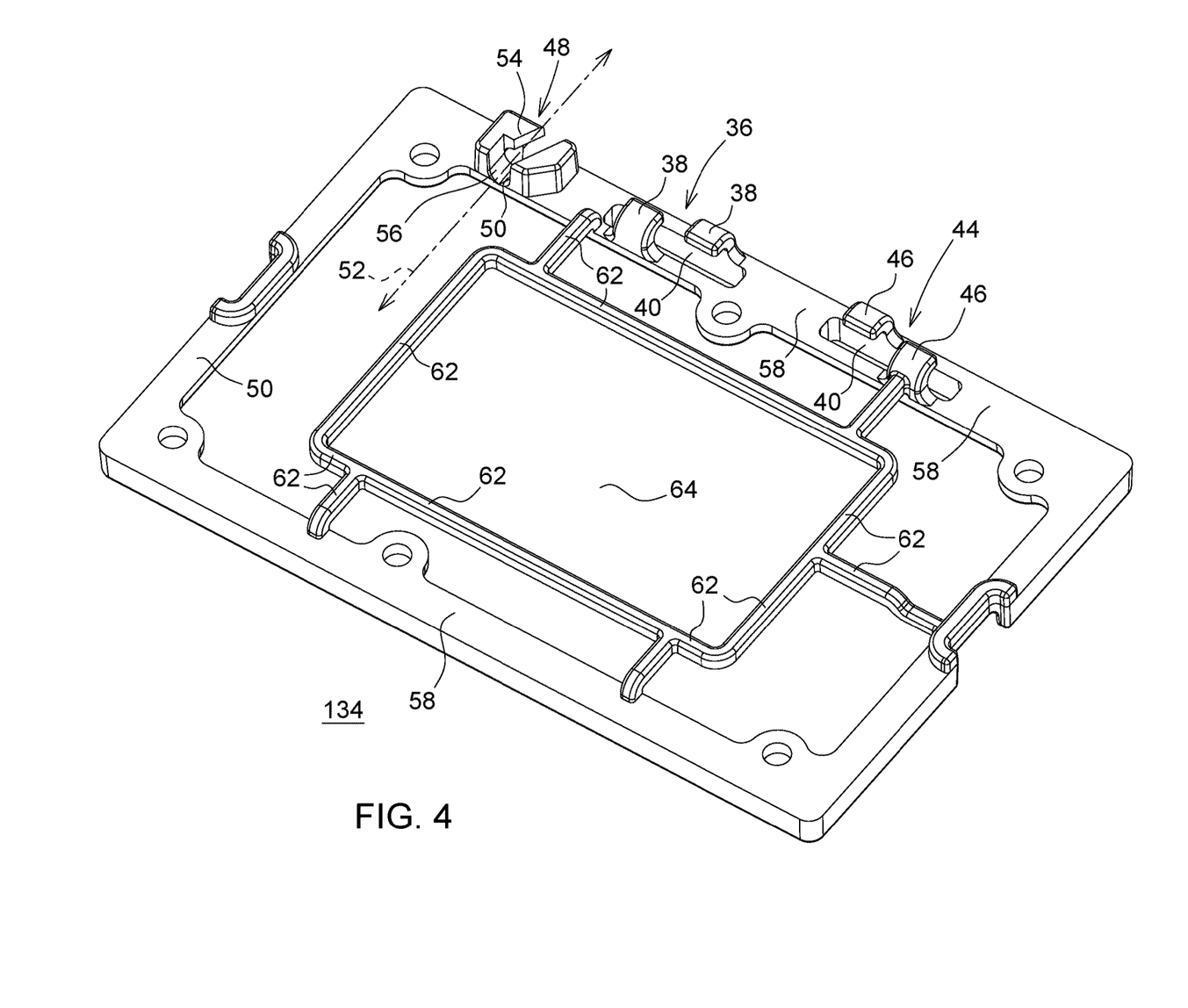
FIG. 4 is a perspective view of an alternate embodiment of a frame with retainers.

In one configuration as illustrated in FIG. 4, the generally rectangular member 58 further comprises structural ribs 62 to reinforce an interior opening 64 of the frame 34. The frame 34 of FIG. 2 is similar to the frame 134 of FIG. 4, except frame 134 further comprises structural ribs. Like reference numbers in FIG. 2 and FIG. 4 indicate like features or elements.

The structural ribs 62 may be positioned after mounting locations and dimensions of electronic components 14 are mounted on the circuit board (12, 112) to avoid interference with the electronic components 14. In one configuration, the frame 34 is composed of a dielectric, such as plastic, a polymer, a fiber filled plastic, an elastomer, a fiber filled polymer, a plastic composite or a polymer composite, where the composites may comprise filler bound within a plastic or polymeric matrix.

Figure 3A:
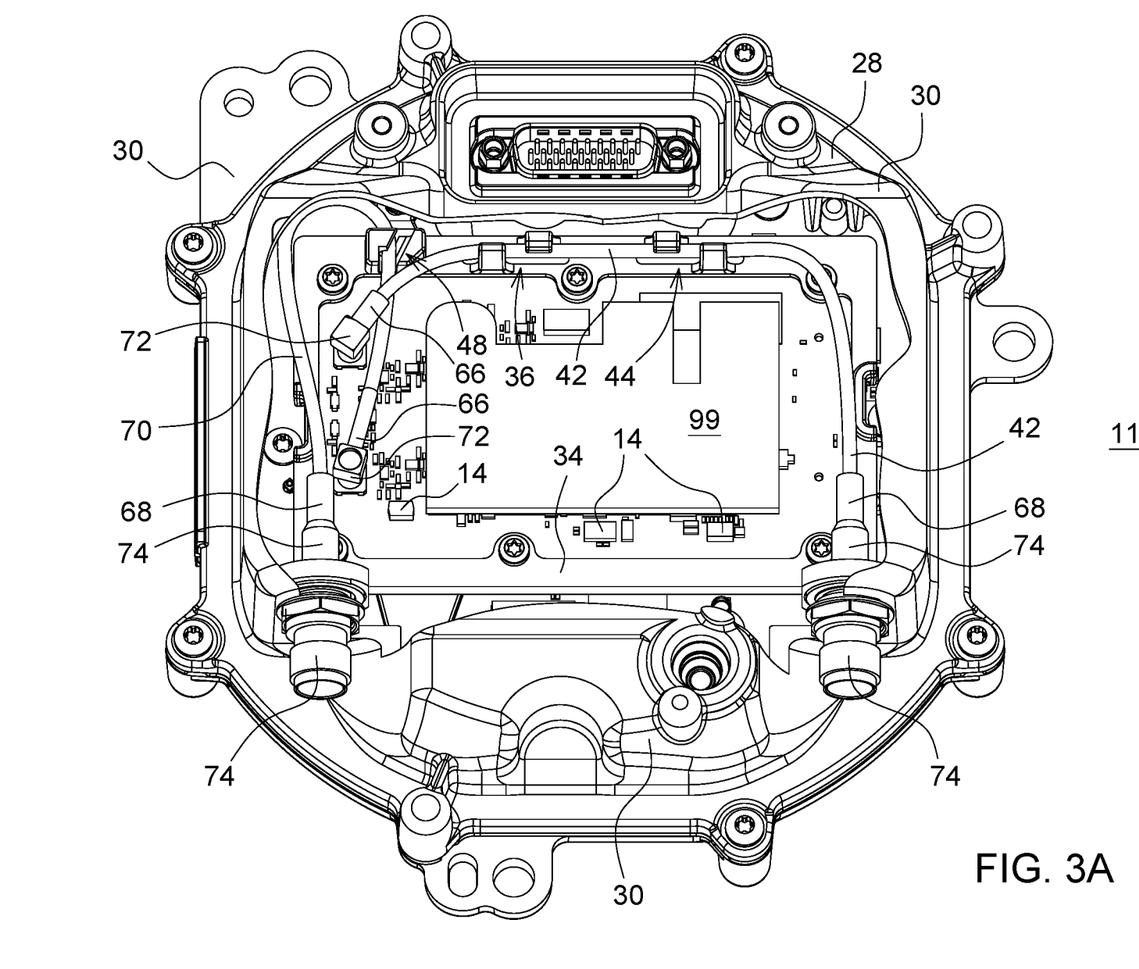
FIG. 3A is a perspective top view of the assembled electronic assembly with the upper enclosure cut away to better illustrate an interior of the electronic assembly with a dielectric thermal pad.
Figure 3B:
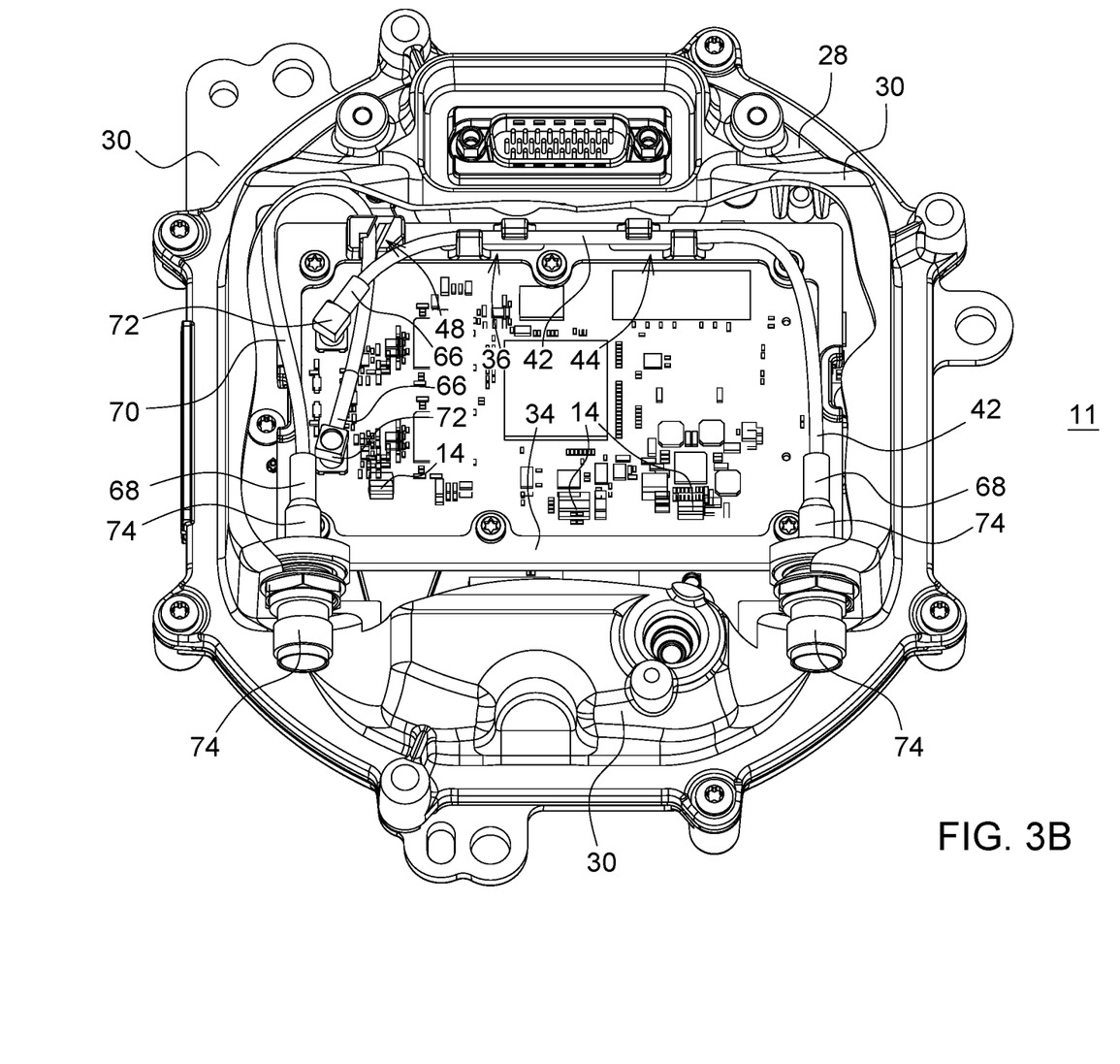
FIG. 3B is a perspective top view of the assembled electronic assembly with the upper enclosure cut away to better illustrate an interior of the electronic assembly without the dielectric thermal pad.
Figure 5A:
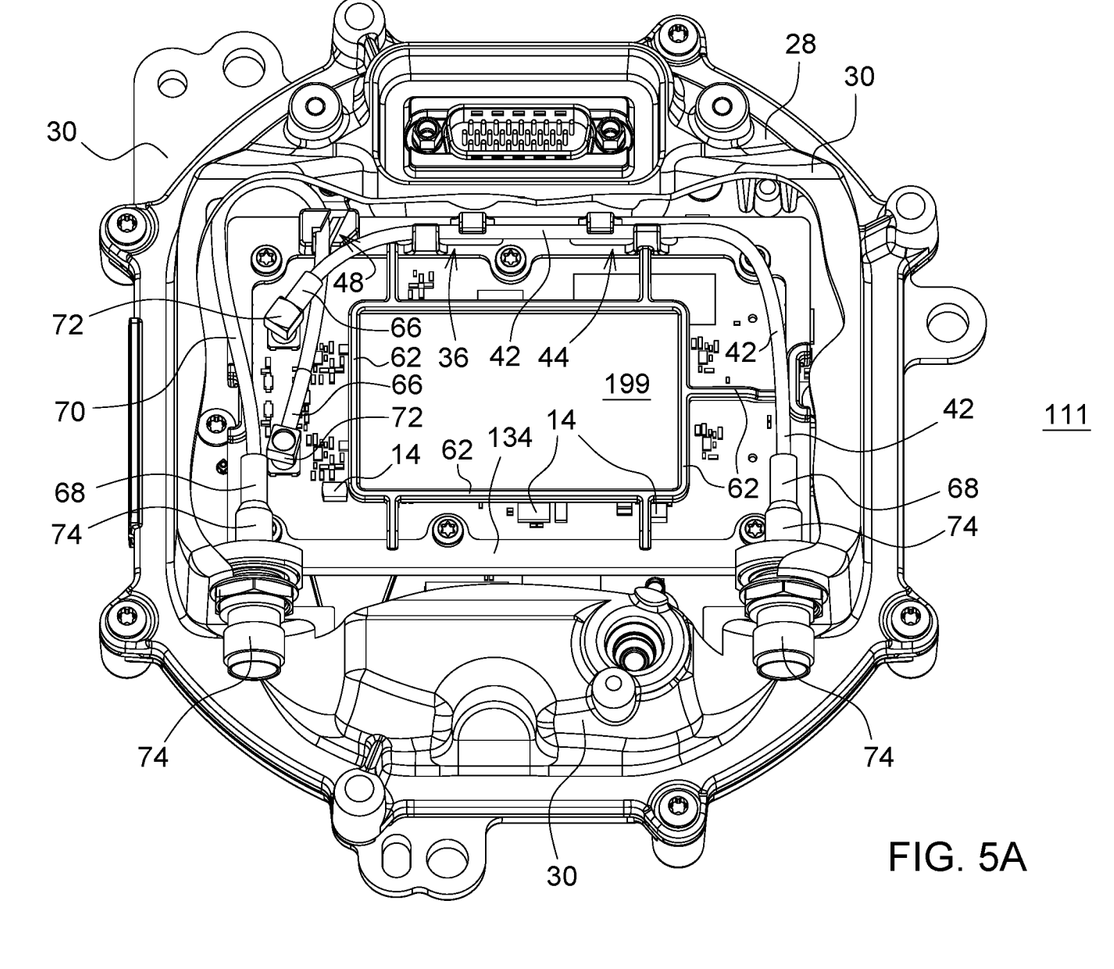
FIG. 5A is a perspective view of an alternate embodiment of the assembled electronic assembly with the upper enclosure cut away to better illustrate an interior of the electronic assembly with a dielectric thermal pad.
Figure 5B:
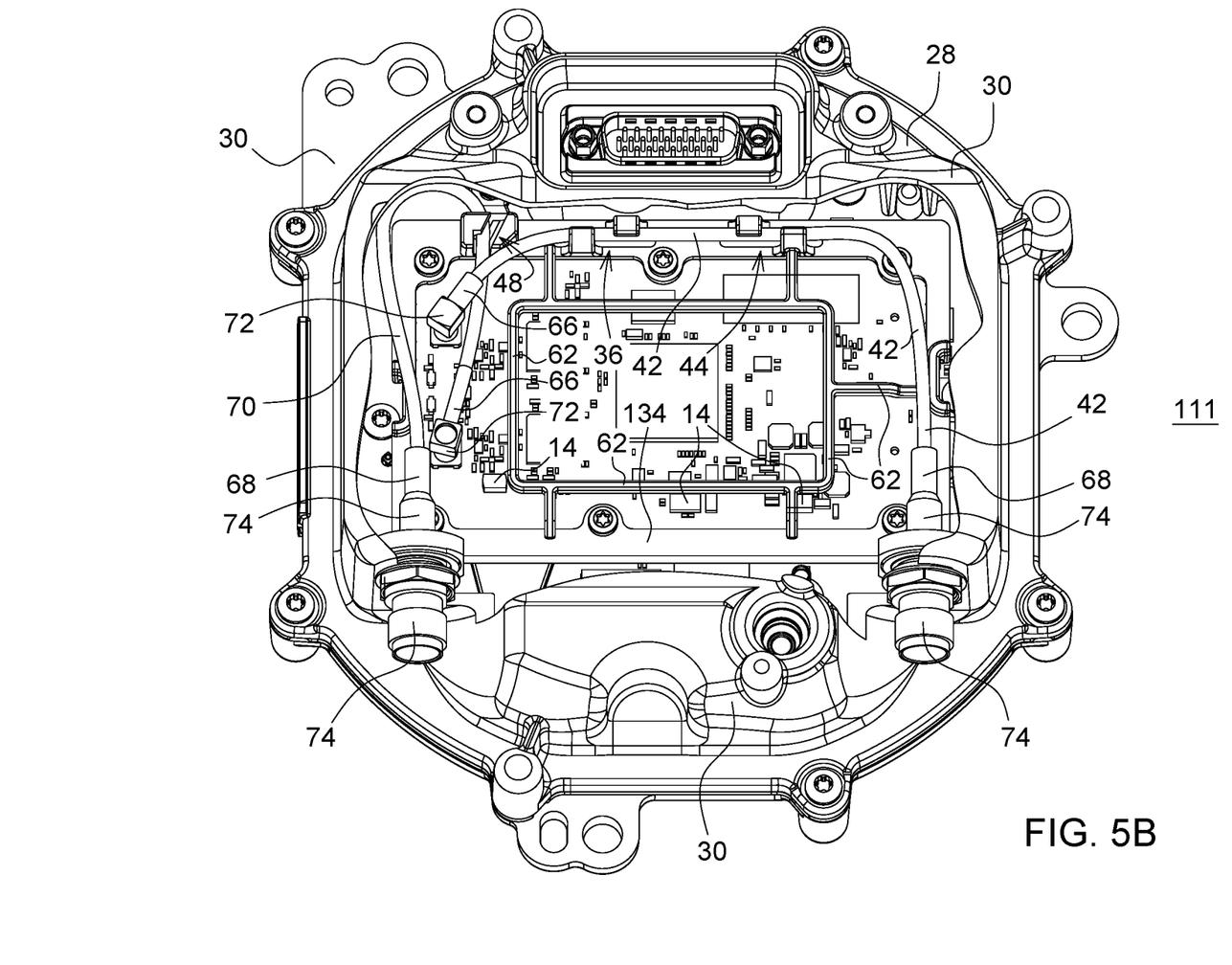
FIG. 5B is a perspective view of an alternate embodiment of the assembled electronic assembly with the upper enclosure cut away to better illustrate an interior of the electronic assembly with a dielectric thermal pad.

The electronic assemblies illustrated in FIG. 3A, FIG. 3B, FIG. 5A, and FIG. 5B are similar, except the embodiment of the electronic assembly 11 of FIG. 3A and FIG. 3B comprises frame 34, whereas the embodiment of the electronic assembly 111 of FIG. 5A and FIG. 5B comprises frame 134. FIG. 3A illustrates one example of a dielectric thermal pad 99 in a central region of the electronic assembly 11, whereas in FIG. 3B the dielectric thermal pad 99 is removed to better reveal the circuit board 12 and its components 14. Similarly, FIG. 5A illustrates a dielectric thermal pad 199 in a central region of the electronic assembly 111, whereas in FIG. 5B the dielectric thermal pad 199 is removed to better reveal the circuit board 12 and its components 14. Like reference numbers in FIG. 3A, FIG. 3B, FIG. 5A and FIG. 5B indicate elements are features.

In certain embodiments, the thermal pad (99, 199) is a compressible dielectric material, such as an elastomer, with a high thermal conductivity that exceeds a thermal conductivity threshold. Although the thermal pad 99 has an irregular polygonal shape, the thermal pad 99 may have any suitable shape that overlies, partially or entirely, the circuit board 12 or its components 14. In one configuration, the thermal pad (99, 199) has a first side (e.g., upper side) that contacts an interior of the upper enclosure 28 or the housing 30 and a second side (e.g., lower side) that contacts one or more heat-generating components 14, where the second side is opposite the first side, or at least a portion of the circuit board 12 to conduct heat or thermal energy away from one or more heat-generating components 14 or the circuit board 12.

In one configuration, an electronic assembly 11 comprises a circuit board 12 having one or more electronic components 14 mounted on the circuit board 12. The circuit board 12 has a first side 16 and a second side 18 opposite the first side 16. The electronic assembly 11 has a lower enclosure 26 and an upper enclosure 28 for mating with the lower enclosure 26 to form a housing 30 to hold the circuit board 12.

A frame (34, 134) overlies the first side 16 or the second side 18 of the circuit board 12. The frame (34, 134) comprises a first retainer 36 for retaining coaxial cable 42. The first retainer 36 comprises a first pair of opposing arcuate members 38 extending from the frame (34, 134); the second retainer 44 comprises a second pair of opposing arcuate members 46 extending from the frame (34, 134) and spaced apart from the first pair of arcuate members 38. For example, the first pair and the second pair of arcuate members (38, 46) secure the coaxial cable 42 (e.g., primary coaxial cable) or route the coaxial cable 42 around a perimeter or periphery 60 of the circuit board 12 to reduce radio frequency coupling or microwave frequency coupling between the coaxial cable 42 and the circuit board 12, its conductive circuit traces (e.g., microstrip or other transmission lines integral with the circuit board 12), and its electronic or electrical components 14.

In one configuration, the coaxial cable 42 has a first end 66 coupled to connector associated with the circuit board 12 and a second end 68 associated with a through-connector mounted in an opening in the housing 30. As illustrated in FIG. 3B, the coaxial cable 42 or primary coaxial cable 42 has a first end 66 that is coupled to the circuit board 12 via a connector 72, such as a surface-mount, through-hole, or an edge-mounted connector; the second side 18 has an external connector 74, which passes through the housing 30 to provide one or more external ports for a baseband signal, a radio frequency signal or a microwave signal. The first retainer 36 and the second retainer 44 secure the coaxial cable 42 between the first end 66 and the second end 68.

In one embodiment, the first retainer 36 and the second retainer 44 secure the coaxial cable 42 along a fixed, stable, and defined path between the first end 66 and the second end 68 to avoid interference in seating between the upper enclosure 28 and the low enclosure during assembly. Accordingly, to maintain consistent performance and consistent radio frequency characteristics, the first retainer 36 and the second retainer 44 maintain the fixed, stable and defined path even in the presence of vibrations that may occur if the electronic assembly 11 is mounted on a vehicle, such as an off-road vehicle or heavy equipment. That is, the first retainer 36 and the second retainer 44 secure the coaxial cable 42 along a defined path between the first end 66 and the second end 68 such that any electromagnetic coupling between the coaxial cable 42 and the circuit board 12, or the electronic components 14, is stable and consistent for mass production and compliance with specifications of electronic performance in the field.

In one configuration, the frame 34 comprises a third retainer 48 comprising a channel 50 with a channel longitudinal axis 52 that crosses the frame (34, 134). The channel 50 has an upper section 54 with a narrowed slot and a lower seating section 56 for seating a secondary coaxial cable 70 with a substantially elliptical or substantially circular cross section. The third retainer 48 secures the secondary cable along a fixed, stable and defined path between the first end 66 and the second end 68 to avoid interference in seating between the upper enclosure 28 and the low enclosure during assembly. Accordingly, to maintain consistent performance and consistent radio frequency characteristics, the third retainer 48 maintains the fixed, stable and defined path even in the presence of vibrations that may occur if the electronic assembly 11 is mounted on a vehicle, such as an off-road vehicle or heavy equipment. That is, the third retainer 48 secures the secondary coaxial cable 70 along a defined path between the first end 66 and the second end 68 such that an electromagnetic coupling between the secondary coaxial cable 70 and the circuit board 12, or the electronic components 14, is stable and consistent for mass production and compliance with specifications of electronic performance in the field.

As illustrated in FIG. 3B, the secondary coaxial cable 70 has a first end 66 that is coupled to the circuit board 12 via a connector 72, such as a surface-mount, through-hole or an edge-mounted connector; the second side 18 has an external connector 74 that passes through the housing 30 to provide one or more external ports for a baseband signal, a radio frequency signal or a microwave signal. The coaxial cable 42 and the secondary coaxial cable 70 have defined paths spatially around or about a perimeter or an exterior of the circuit board 12 to reduce radio frequency coupling or microwave frequency coupling between the coaxial cable 42 the secondary coaxial cable 70 and the circuit board 12, or its electrical components.

In any configuration, the frame (34, 134) comprises a generally rectangular member 58 or another shape the tracks the perimeter of a circuit board 12. For example, the frame (34, 134) may comprise a generally rectangular member 58 where the size and shape of the frame (34, 134) may track, follow, be coextensive with, or commensurate with an outer periphery 60 or perimeter of the circuit board 12. In one configuration, the generally rectangular member 58 further comprises structural ribs 62 to reinforce an interior opening 64 of the frame (34, 134). Further, the ribs 62 may be used to locate, position, align and/or retain (e.g., laterally retain) a generally rectangular thermal pad 199, as best illustrated in FIG. 5A. For example, the ribs 62 may hold or retain captive the generally rectangular pad 199 to prevent lateral movement; even if the electronic assembly 111 is exposed to lateral acceleration or vibration associated with installation in a vehicle. For example, in FIG. 5A, the thermal pad 199 is disposed between the circuit board 12, or its one or more electronic components 14, and the housing 30 to dissipate heat, where the ribs retain laterally the thermal pad 199.

Having described one or more preferred embodiments, it will become apparent that various modifications can be made without departing from the scope of the invention as defined in the accompanying claims.

The following is claimed:

1. An electronic assembly comprising:
   a circuit board having one or more electronic components mounted on the circuit board, the circuit board having a first side and a second side opposite the first side;
   a lower enclosure;
   an upper enclosure for mating with the lower enclosure to form a housing to hold the circuit board;
   a frame overlying the first side or the second side of the circuit board, the frame comprising a first retainer and a second retainer for retaining coaxial cable, the first retainer comprising a first pair of opposing arcuate members extending from the frame; wherein the first retainer and the second retainer secure the coaxial cable along a defined path between the first end and the second end such that any electromagnetic coupling between the coaxial cable and the circuit board, or the electronic components, is stable and consistent for mass production and electronic performance in the field.

2. The electronic assembly according to claim 1 wherein the first retainer further comprises a longitudinal groove in the frame between the first pair of opposing arcuate members.

3. The electronic assembly according to claim 2 wherein the first pair of arcuate members and the groove are configured to hold cooperatively a cable with a substantially elliptical or substantially circular cross section.

4. The electronic assembly according to claim 2 wherein a coaxial cable is secured by the first retainer during assembly or mating of the upper enclosure and the lower enclosure to prevent the coaxial cable from interfering with the seating of the upper enclosure and the lower enclosure.

5. The electronic assembly according to claim 1 wherein the second retainer comprising a second pair of opposing arcuate members extending from the frame.

6. The electronic assembly according to claim 5 wherein the frame comprises a longitudinal groove in the frame between the second pair of opposing arcuate members.

7. The electronic assembly according to claim 5 wherein the second pair of arcuate members and the groove are configured to hold cooperatively a cable with a substantially elliptical or substantially circular cross section.

8. The electronic assembly according to claim 1 wherein the frame comprises a third retainer comprising a channel with a longitudinal channel axis that crosses the frame, the channel having an upper section with a narrowed slot and a lower seating section for seating a cable with a substantially elliptical or substantially circular cross section.

9. The electronic assembly according to claim 1 wherein the frame comprises a generally rectangular member.

10. The electronic assembly according to claim 9 wherein the generally rectangular member further comprises structural ribs to reinforce an interior opening of the frame.

11. An electronic assembly comprising:
    a circuit board having one or more electronic components mounted on the circuit board, the circuit board having a first side and a second side opposite the first side;
    a lower enclosure;
    an upper enclosure for mating with the lower enclosure to form a housing to hold the circuit board;
    a frame overlying the first side or the second side of the circuit board, the frame comprising a first retainer and second retainer for retaining coaxial cable, the first retainer comprising a first pair of opposing arcuate members extending from the frame, the second retainer comprising a second pair of opposing arcuate members extending from the frame and spaced apart from the first pair on the frame;

a coaxial cable having a first end coupled to a connector associated with the circuit board and a second end associated with a through-connector mounted in an opening in the housing, wherein the first retainer and the second retainer secure the coaxial cable between the first end and the second end;

wherein the first retainer and the second retainer secure the coaxial cable along a defined path between the first end and the second end such that any electromagnetic coupling between the coaxial cable and the circuit board, or the electronic components, is stable and consistent for mass production and electronic performance in the field.

12. The electronic assembly according to claim 11 wherein the first retainer and the second retainer secure the coaxial cable along a defined path between the first end and the second end to avoid interference in seating between the upper enclosure and the low enclosure during assembly.

13. The electronic assembly according to claim 11 wherein the frame comprises a third retainer comprising a channel with a longitudinal channel axis that crosses the frame, the channel having an upper section with a narrowed slot and a lower seating section for seating a secondary coaxial cable with a substantially elliptical or substantially circular cross section.

14. The electronic assembly according to claim 13 wherein the third retainer secures the secondary cable along a defined path between the first end and the second end to avoid interference in seating between the upper enclosure and the low enclosure during assembly.

15. The electronic assembly according to claim 13 wherein the third retainer secures the secondary coaxial cable along a defined path between the first end and the second end such that an electromagnetic coupling between the secondary coaxial cable and the circuit board, or the electronic components, is stable and consistent for mass production and electronic performance in the field.

16. The electronic assembly according to claim 15 wherein the coaxial cable and the secondary coaxial cable have defined paths spatially around or about a perimeter or an exterior of the circuit board to reduce baseband frequency, radio frequency coupling or microwave frequency coupling between the coaxial cable the secondary coaxial cable and the circuit board, or its electrical components.

17. The electronic assembly according to claim 11 wherein the frame comprises a generally rectangular member.

18. The electronic assembly according to claim 17 wherein the generally rectangular member further comprises structural ribs to reinforce an interior opening of the frame.

19. The electronic assembly according to claim 18 further comprising:

a thermal pad between the circuit board, or its one or more electronic components, and the housing to dissipate heat, where the ribs retain laterally the thermal pad.

* * * * *